(12) United States Patent
Lin (10) Patent No.: US 7,180,593 B2
(45) Date of Patent: Feb. 20, 2007

(54) OVERLAY MARK FOR ALIGNING DIFFERENT LAYERS ON A SEMICONDUCTOR WAFER

(75) Inventor: Yen Yu Lin, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 427 days.

(21) Appl. No.: 10/702,797

(22) Filed: Nov. 5, 2003

(65) Prior Publication Data

US 2005/0094145 A1 May 5, 2005

(51) Int. Cl.
*G01B 11/00* (2006.01)
*H01L 23/544* (2006.01)

(52) U.S. Cl. .......................... 356/401; 257/797; 430/22
(58) Field of Classification Search ........ 356/399–401; 257/797; 438/975, 401
See application file for complete search history.

(56) References Cited

U.S. PATENT DOCUMENTS

| | | | | |
|---|---|---|---|---|
| 6,137,578 A | * | 10/2000 | Ausschnitt | 356/399 |
| 6,350,548 B1 | * | 2/2002 | Leidy et al. | 430/22 |
| 6,778,275 B2 | * | 8/2004 | Bowes | 356/400 |
| 6,801,313 B1 | * | 10/2004 | Yokota | 356/401 |
| 2003/0174879 A1 | * | 9/2003 | Chen | 382/151 |

* cited by examiner

*Primary Examiner*—Layla G. Lauchman
(74) *Attorney, Agent, or Firm*—Seyfarth Shaw LLP (57) ABSTRACT

The present invention provides an overlay mark for aligning different layers on a semiconductor wafer. The overlay mark comprises a bar-in-bar mark and two bar sets on the semiconductor wafer. The bar-in-bar mark comprises an inner bar mark positioned in one of the pre-layer and an outer bar mark positioned in the other pre-layer. The two bar sets are perpendicular to each other, and each of two bar sets comprises two parallel bars. The bars can be connected and the lengths of the bars can be the same or different.

13 Claims, 9 Drawing Sheets

OVERLAY MARK FOR ALIGNING DIFFERENT LAYERS ON A SEMICONDUCTOR WAFER

BACKGROUND OF THE INVENTION (A) Field of the Invention

The present invention relates to an overlay mark for checking alignment accuracy, and more particularly, to an overlay mark for aligning different layers on a semiconductor wafer.

(B) Description of the Related Art

Nowadays, the semiconductor devices and integrated circuits include multi-layer structures having dimensions smaller than one micrometer. Proper alignment of different layers is essential for proper performance of the fabricated semiconductor devices and circuits. Overlay measurements are routinely performed to verify the proper alignment. Lack of proper alignment typically results in erroneous measurement of specification and fails to meet the requirements of the client.

Overlay measurements optically measure the relative positions of the overlay marks on different layers of a structure on the semiconductor wafer. More particularly, a rectangular overlay mark is formed on each layer of the structure. When two rectangular overlay marks on two consecutive layers are centered with respect to each other, the two layers are properly aligned to each other. The rectangular overlay marks are also referred to as bar-in-bar patterns.

Figure 1:
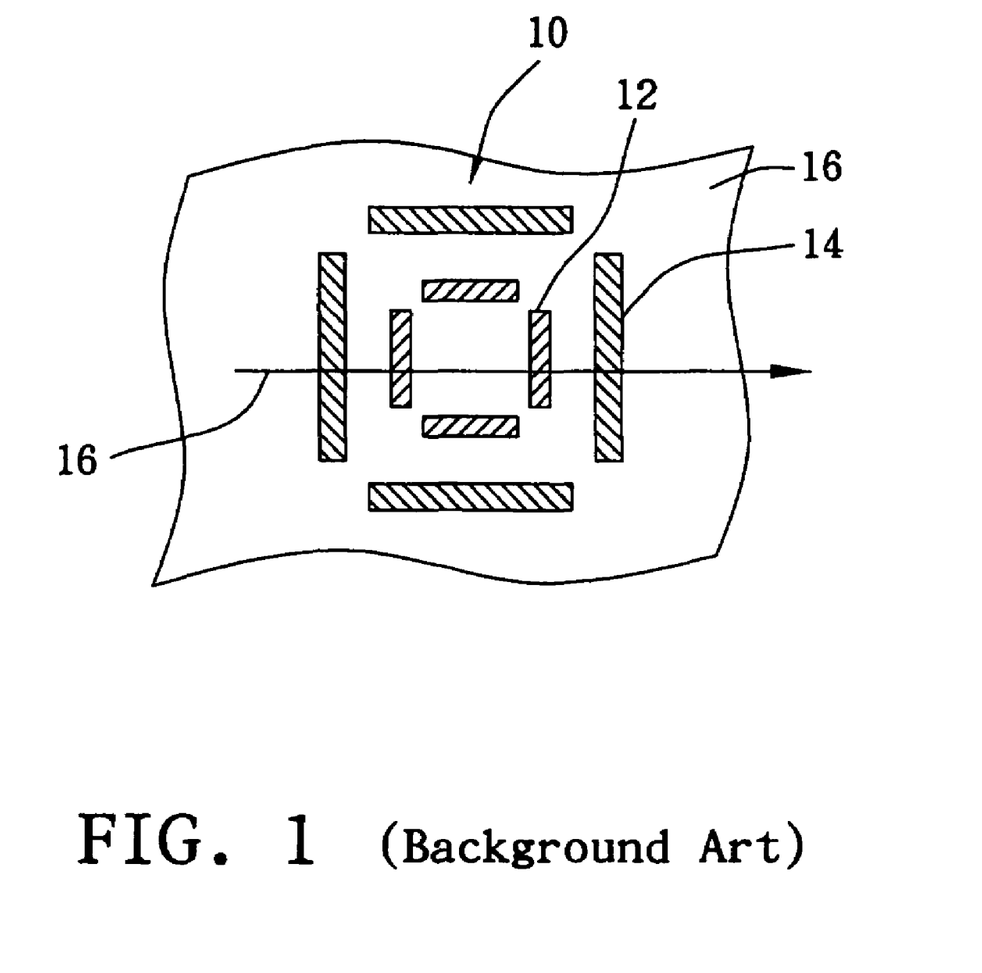
FIG. 1 is a top view of an overlay mark for checking alignment accuracy according to the prior art.

FIG. 1 is a top view of an overlay mark 10 for checking alignment accuracy according to the prior art. As shown in FIG. 1, the overlay mark 10 includes four inner bars 12 and four outer bars 14 on a semiconductor wafer 16, wherein the outer bars 14 represent the pattern of the pre-layer, and the inner bars 12 represent the pattern of the present layer, such as a photoresist layer. Each bar is a side of the rectangle and the sides are not connected, wherein the rectangle formed by the outer bars 14 encloses the rectangle formed by the inner bars 12.

In the process of checking alignment accuracy, a checking beam scans in a scanning direction 18 across the two outer bars 14 and two inner bars 12, as shown in FIG. 1. After scanning, the signals of the actual position representing the outer bars 14 and the inner bars 12 are read. In addition, the differences (overlay error) between the mean values of the positions of the two outer bars 12 and 14 are calculated. If the overlay error is larger than an acceptable deviation value, the alignment between the pattern of the pre-layer and that of the photoresist layer will not meet the accuracy requirements. Under this situation, the photoresist layer has to be removed, and a second photolithography process has to be repeated until the overlay error is smaller than the acceptable deviation value.

Figure 2:
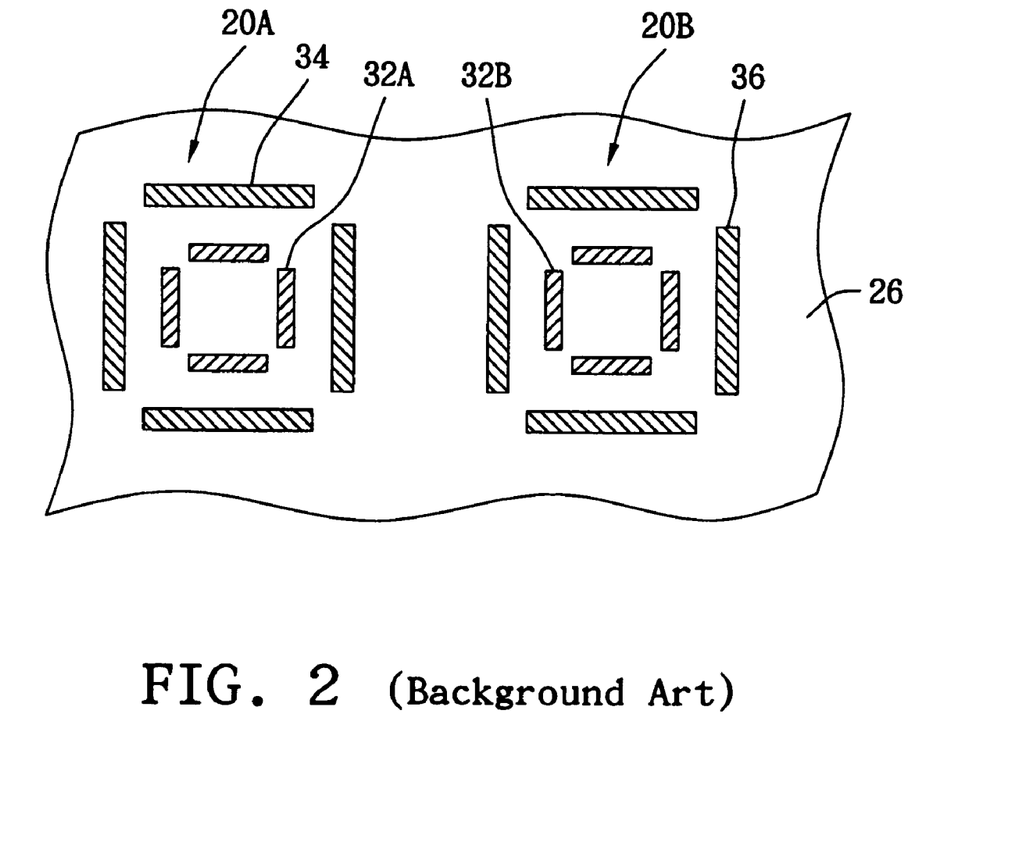
FIG. 2 is a schematic diagram showing the application of the bar-in-bar overlay mark for checking alignment accuracy between three layers on a semiconductor wafer according to the prior art.

FIG. 2 is a schematic diagram showing the application of the bar-in-bar pattern for checking alignment accuracy between three layers on a semiconductor wafer 26 according to the prior art. As shown in FIG. 2, to check alignment accuracy between three layers, the prior art technology used two separate bar-in-bar patterns 20A and 20B. The bar-in-bar pattern 20A is formed of four inner bars 32A and four outer bars 34, while the bar-in-bar pattern 20B is formed of four inner bars 32B and four outer bars 36. The outer bars 34 represent the pattern of the first pre-layer, the inner bars 32A and 32B represent the pattern of the second pre-layer, and the outer bars 36 represent the pattern of the present layer, such as a photoresist layer.

According to the prior art, the bar-in-bar patterns 20A is used for checking alignment accuracy between the first pre-layer and the second pre-layer, and the bar-in-bar patterns 20B is used for checking alignment accuracy between the second pre-layer and the present layer. Since there are two set of inner bars 32A, 32B required to connect the outer bars 34, 36, respectively, the area cost is very high for the two bar-in-bar patterns 20A, 20B positioned on different areas of the semiconductor wafer 26. As the design rule shrinks and the fabrication of the integrated circuits tends to use multi-layer design, the area cost issue of the bar-in-bar patterns becomes seriously high.

Additionally, since the four outer bars 34 and the four outer bars 36 do not possess the bar-in-bar relationship, the alignment accuracy between the first pre-layer and the present layer can not be checked by direct measuring the positions of the four outer bars 34 and the four outer bars 36. Instead, the alignment accuracy between the first pre-layer and the present layer can only be obtained from the alignment accuracy of the bar-in-bar patterns 20A and 20B that requires to measure all positions of the inner bars 32A, 32B and the outer bars 34, 36 of different bar-in-bar patterns. However, this will increase the measuring time and the deviation between the bar-in-bar patterns 20A and 20B, and will certainly influence the checking result between the first pre-layer and the present layer.

SUMMARY OF THE INVENTION

The objective of the present invention is to provide an overlay mark for aligning different layers on a semiconductor wafer to avoid deviation and save the area cost.

In order to achieve the above-mentioned objective and avoid the problems of the prior art, the present invention provides an overlay mark for aligning different layers on a semiconductor wafer. The overlay mark comprises a bar-in-bar mark and two bar sets on the semiconductor wafer. The bar-in-bar mark comprises an inner bar mark positioned in one of the pre-layer and an outer bar mark positioned in the other pre-layer. The two bar sets are perpendicular to each other, and each of two bar sets comprises two parallel bars. The bars can be connected and the lengths of the bars can be the same or different.

Compared with the prior art technology, the present invention possesses the following advantages since the marks of different layers for checking alignment accuracy are positioned on the same area of the semiconductor wafer:

1. The alignment accuracy of different layers is measured from the same overlay mark according to the present invention, which avoids the deviation resulted from different overlay marks according the prior art.
2. The area cost required by the overlay mark of the present invention is lower than that of the prior art.

BRIEF DESCRIPTION OF THE DRAWINGS

Other objectives and advantages of the present invention will become apparent upon reading the following description and upon reference to the accompanying drawings in which.

DETAILED DESCRIPTION OF THE INVENTION

Figure 3:
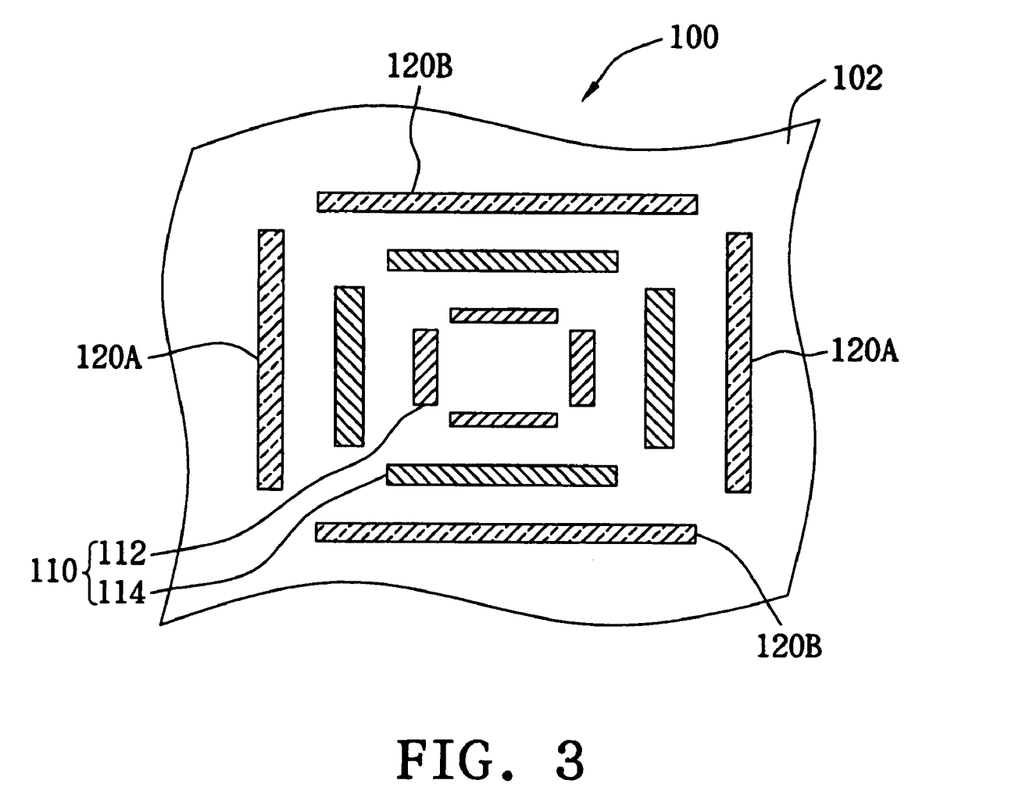
FIG. 3 is a top view of an overlay mark for aligning different layers on a semiconductor wafer according to a first embodiment of the present invention.

FIG. 3 is a top view of an overlay mark 100 for aligning different layers on a semiconductor wafer 102 according to the first embodiment of the present invention. As shown in FIG. 3, the overlay mark 100 comprises a bar-in-bar mark 110 and two bar sets 120A, 120B on the semiconductor wafer 102. The bar-in-bar mark 110 comprises an inner bar mark 112 disposed on a first pre-layer and an outer bar mark 114 disposed on a second pre-layer. The inner bar mark 112 represents the pattern of a first pre-layer, and the outer bar mark 114 represents the pattern of a second pre-layer. The inner bar mark 112 comprises four bars, and the outer bar mark 114 comprises four bars outside the inner bar mark 112. The two bar sets 120A, 120B are perpendicular to each other, and each of two bar sets 120A, 120B comprises two parallel bars. The lengths of the two bar sets 120A, 120B are different, and the two bar sets 120A, 120B together form a rectangular pattern outside the bar-in-bar mark 110.

Figure 4A:
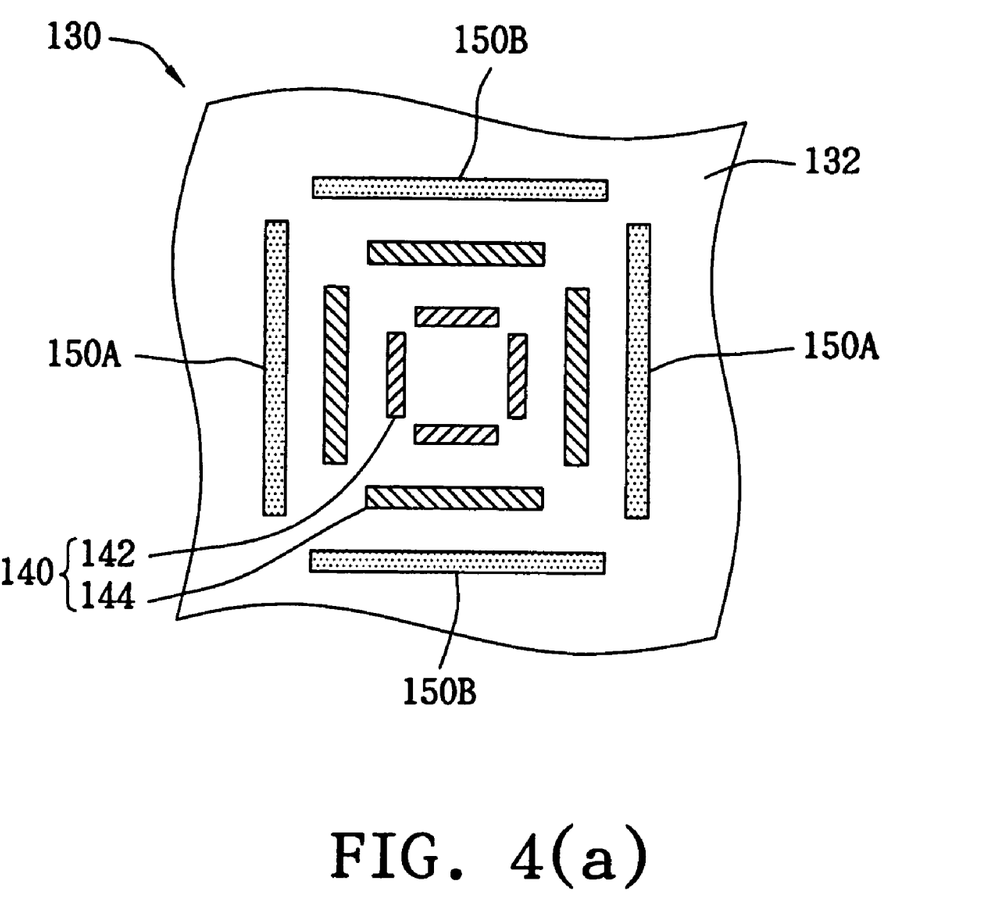
FIG. 4(a) to FIG. 4(d) are top views of an overlay mark for aligning different layers on a semiconductor wafer according to a second embodiment of the present invention.
Figure 4B:
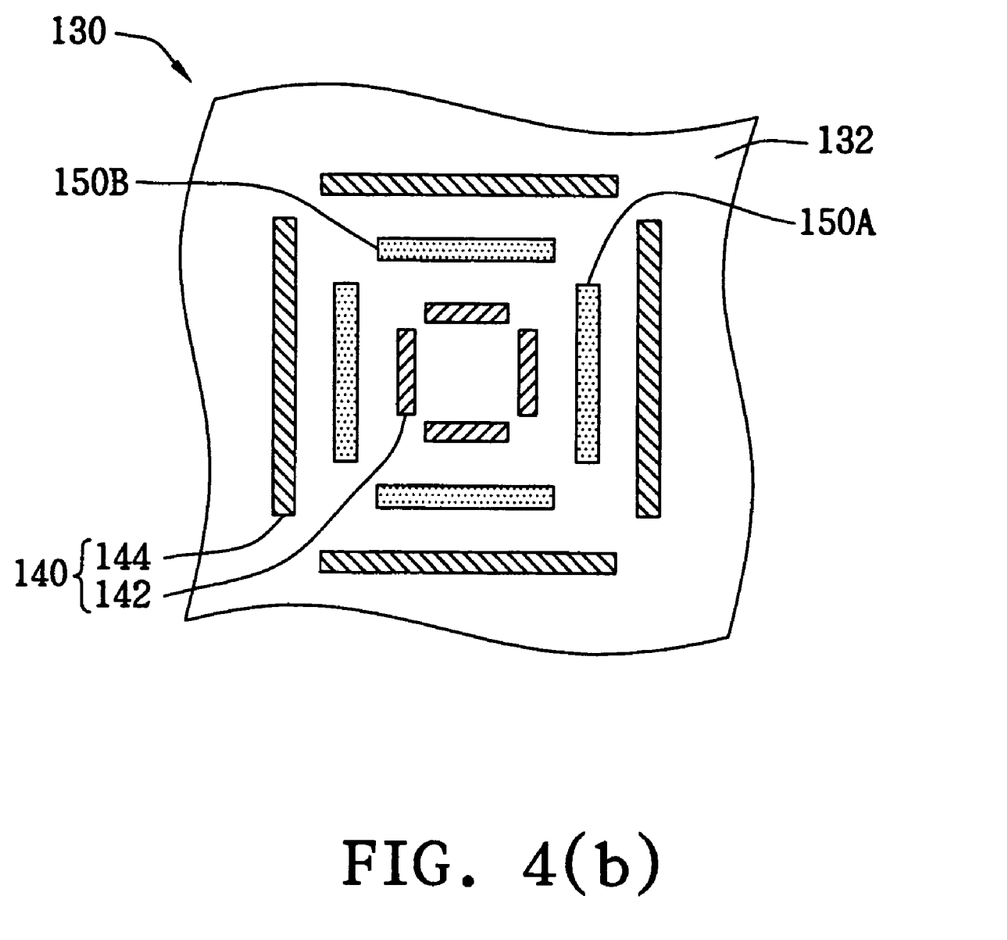
Figure 4C:
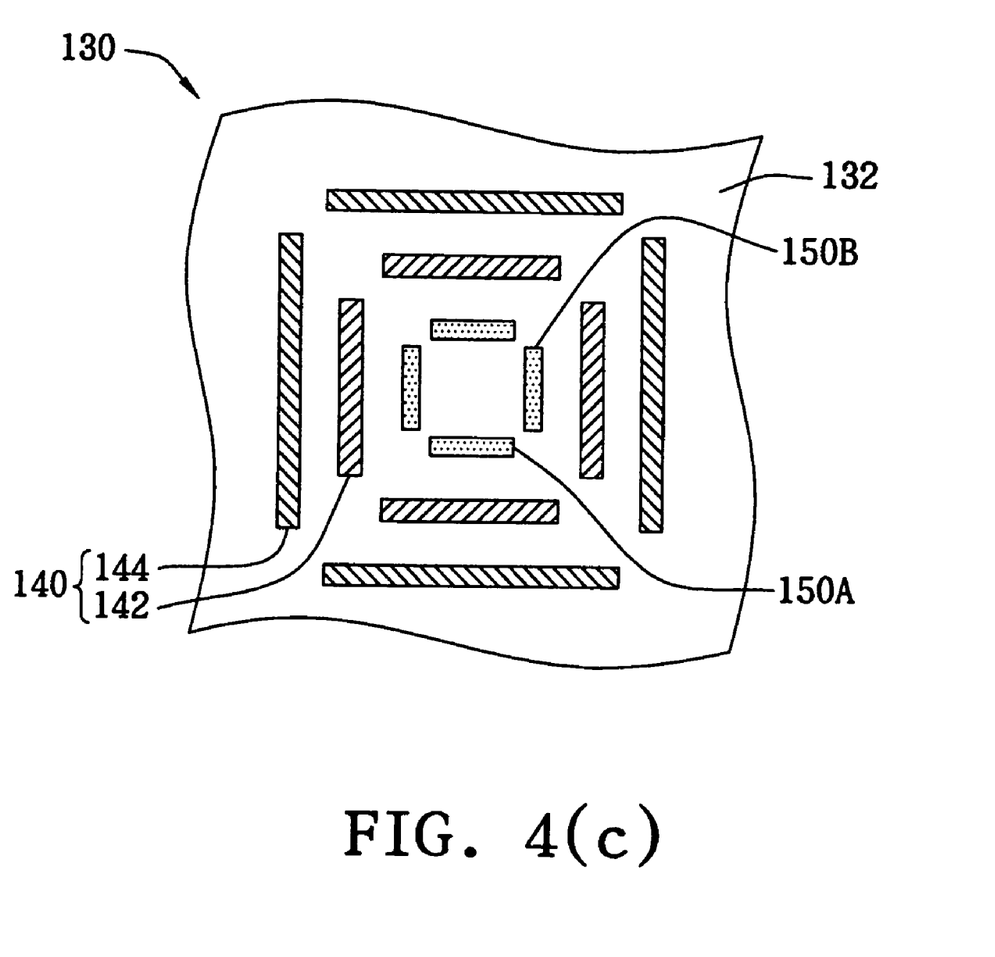
Figure 4D:
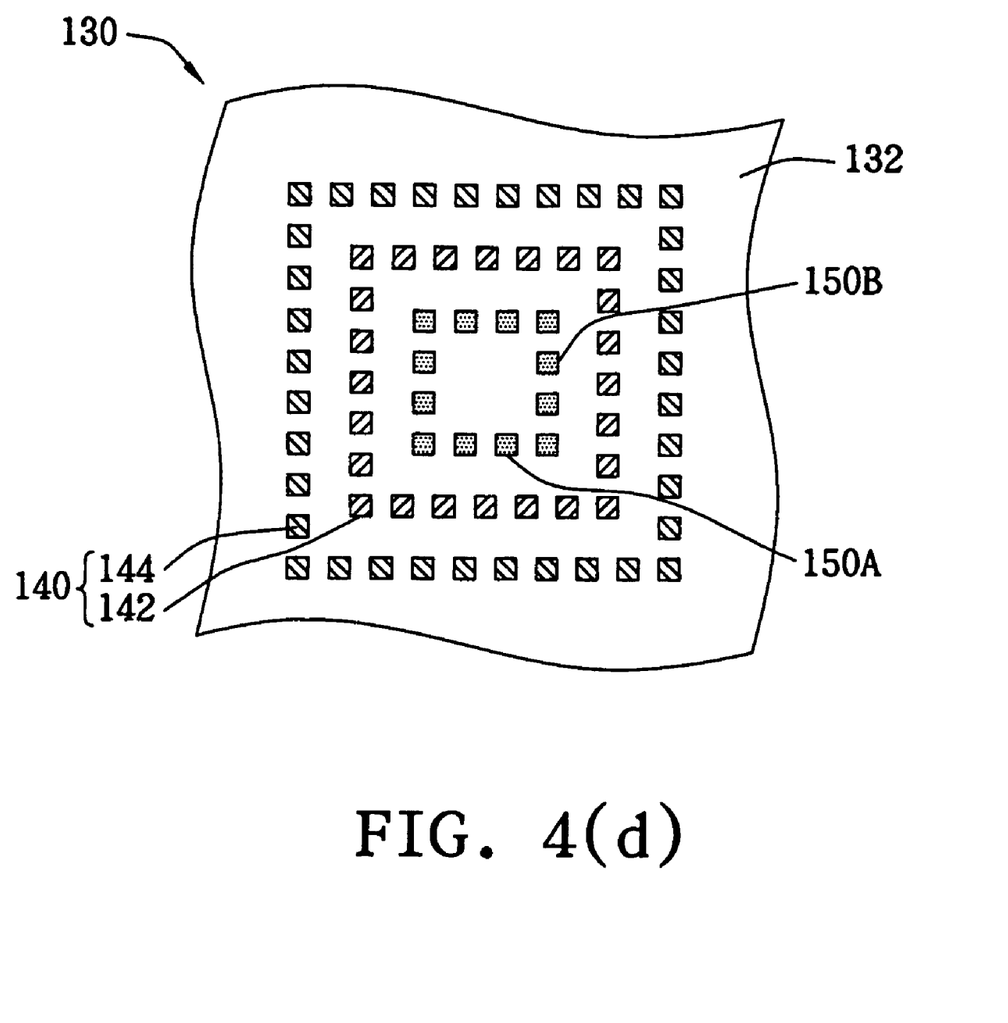

FIG. 4(a) to FIG. 4(d) are top views of an overlay mark 130 for aligning different layers on a semiconductor wafer 132 according to the second embodiment of the present invention. As shown in FIG. 4(a), the lengths of the two bar set 150A, 150B are the same, and these two bar sets together form a square pattern outside a bar-in-bar mark 140 formed of an inner bar mark 142 and an outer bar mark 144. The two bar sets 150A, 150B can be positioned between the inner bar mark 142 and the outer bar mark 144, as shown in FIG. 4(b), or inside the bar-in-bar mark 140, as shown in FIG. 4(c). In addition, the bar-in-bar mark 140 and the two bar sets 150A, 150B can consist of segments patterns having a plurality of dot-marks, as shown in FIG. 4(d).

Figure 5A:
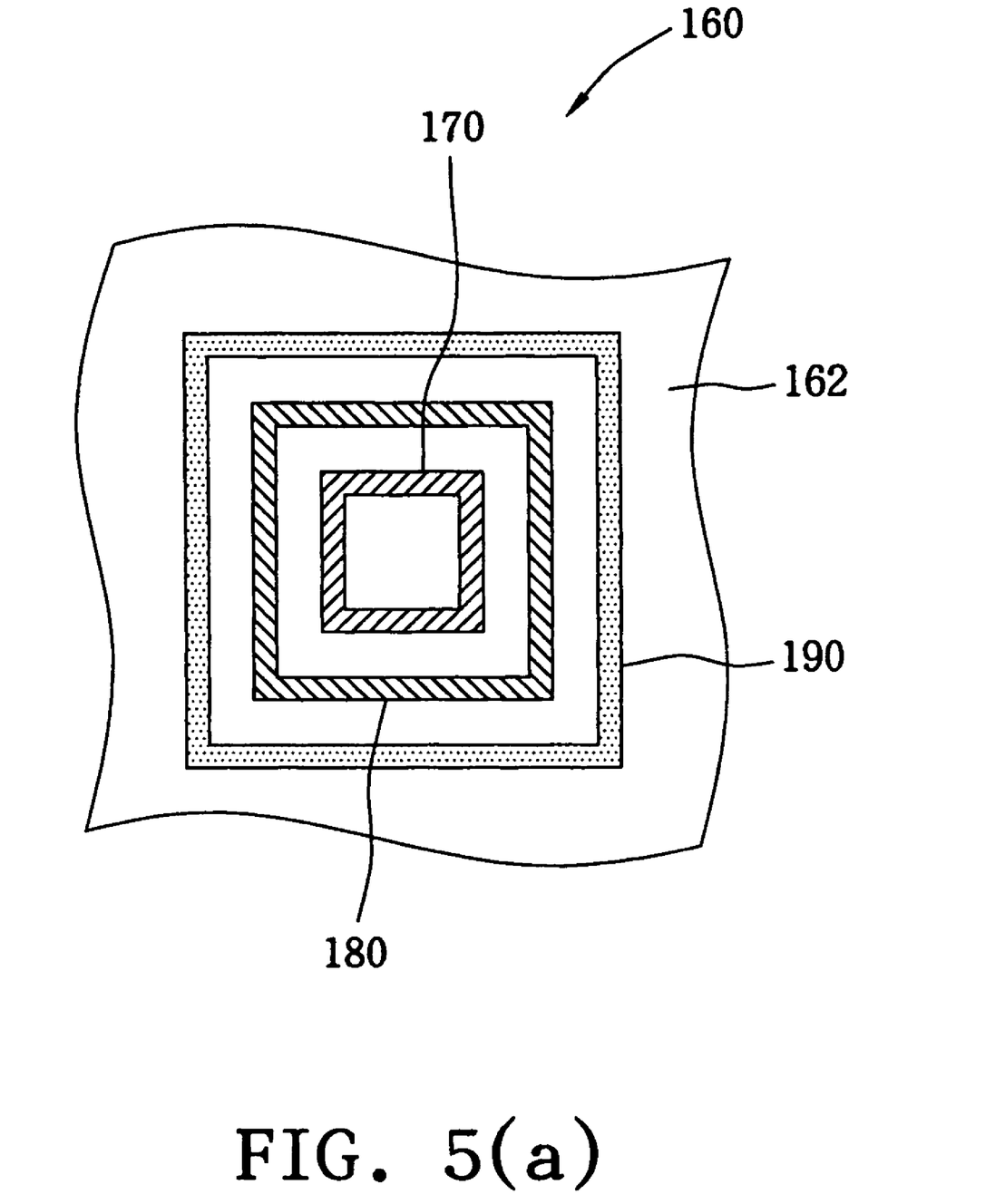
FIG. 5(a) and FIG. 5(b) are top views of an overlay mark for aligning different layers on a semiconductor wafer according to a third embodiment of the present invention.
Figure 5B:
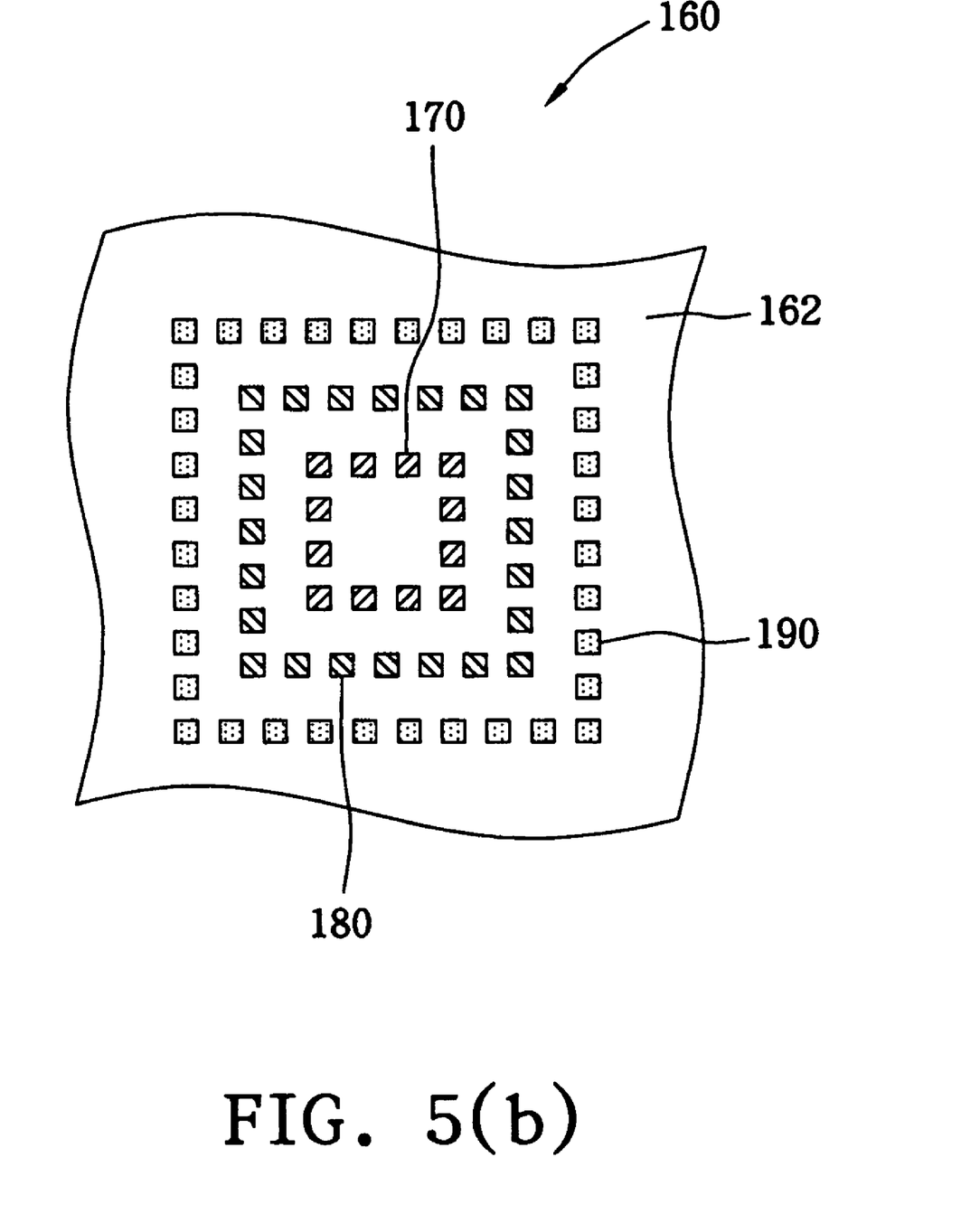

FIG. 5(a) and FIG. 5(b) are top views of an overlay mark 160 for aligning different layers on a semiconductor wafer 162 according to the third embodiment of the present invention. As shown in FIG. 5(a), the overlay mark 160 comprises a first mark 170, a second mark 180 positioned outside the first mark 170 and a third mark 190 positioned outside the second mark 180. The first mark 170 represents the pattern of a first pre-layer, the second mark 180 represents the pattern of a second pre-layer, and the third mark 190 represents the pattern of a third layer on a semiconductor wafer 162. Compared with the overlay mark 130 shown in the FIG. 4(a), the first mark 170 can be regarded as being formed of four connected inner bars, and so can the second mark 180 and the third mark 190. Besides, the first mark 170, the second mark 180 and the third mark 190 can consist of segment patterns, as shown in FIG. 5(b).

Compared with the prior technology, the present invention possesses the following advantages since the marks of different layers for checking alignment accuracy are positioned at the same area on the semiconductor wafer:

1. The deviation resulted from the different overlay marks can be avoided:
    The deviation problem of the prior art technology is resulted from using different overlay marks. Since the alignment accuracy of different layers are measured from the same overlay mark at the same area on the semiconductor wafer according to the present invention, there will be no deviation resulted from using the different overlay marks.
2. The area cost required can be decreased:
    To check alignment accuracy between three layers, one of the three layers has to provide two marks to connect the marks of the other two layers according to the prior art, respectively. On the contrary, since marks of different layers for checking alignment accuracy are positioned at the same area, there is only one mark required for each layer to check alignment accuracy between three layers so that the area cost can be decreased according to present invention.

The above-described embodiments of the present invention are intended to be illustrative only. Numerous alternative embodiments may be devised by those skilled in the art without departing from the scope of the following claims.

What is claimed is:

1. An overlay mark for aligning different layers on a semiconductor wafer, the overlay mark comprising:
    a bar-in-bar mark comprising an inner bar mark of a first pre-layer and an outer bar mark of a second pre-layer; and
    two bar sets perpendicular to each other, wherein the two bar sets enclose the bar-in-bar mark or are enclosed by the bar-in-bar mark,
    wherein the bar-in-bar mark and the two bar sets consist of segment patterns having a plurality of dot-marks.

2. The overlay mark for aligning different layers on a semiconductor wafer of claim 1, wherein the lengths of the two bar sets are different.

3. The overlay mark for aligning different layers on a semiconductor wafer of claim 1, wherein the lengths of the two bar sets are the same.

4. The overlay mark for aligning different layers on a semiconductor wafer of claim 1, wherein the two bar sets are connected.

5. The overlay mark for aligning different layers on a semiconductor wafer of claim 1, wherein the two bar sets are positioned between the inner bar mark and the outer bar mark.

6. The overlay mark for aligning different layers on a semiconductor wafer of claim 1, wherein the two bar sets are positioned inside the inner bar mark.

7. An overlay mark for aligning different layers on a semiconductor wafer, the overlay mark comprising:
    a first mark consisting of segment patterns having a plurality of dot-marks and being disposed on a first layer;
    a second mark disposed on a second layer and enclosing the first mark; and
    a third mark disposed on a third layer and enclosing the second mark.

8. The overlay mark for aligning different layers on a semiconductor wafer of claim 7, wherein the first mark comprises four bars forming a rectangular pattern.

9. The overlay mark for aligning different layers on a semiconductor wafer of claim 8, wherein the rectangular pattern is a square pattern.

10. The overlay mark for aligning different layers on a semiconductor wafer of claim 8, wherein the four bars are connected.

11. The overlay mark for aligning different layers on a semiconductor wafer of claim 7, wherein the first mark comprises two bar sets perpendicular to each other.

12. The overlay mark for aligning different layers on a semiconductor wafer of claim 11, wherein each bar set comprises two parallel bars.

13. The overlay mark for aligning different layers on a semiconductor wafer of claim 11, wherein the lengths of the two bar sets are different.

* * * * *